US011017185B2

(12) United States Patent
Forster

(10) Patent No.: US 11,017,185 B2
(45) Date of Patent: May 25, 2021

(54) PROGRAMMING AND TESTING OF WIRE RFID TAGS

(71) Applicant: AVERY DENNISON RETAIL INFORMATION SERVICES, LLC, Mentor, OH (US)

(72) Inventor: Ian J. Forster, Chelmsford (GB)

(73) Assignee: Avery Dennison Retail Information Services LLC, Mentor, OH (US)

( * ) Notice: Subject to any disclaimer, the term of this patent is extended or adjusted under 35 U.S.C. 154(b) by 338 days.

(21) Appl. No.: 15/815,387

(22) Filed: Nov. 16, 2017

(65) Prior Publication Data

US 2018/0137313 A1    May 17, 2018

Related U.S. Application Data

(60) Provisional application No. 62/422,968, filed on Nov. 16, 2016.

(51) Int. Cl.
*G01R 31/317* (2006.01)
*G06K 19/077* (2006.01)
(Continued)

(52) U.S. Cl.
CPC ....... *G06K 7/0095* (2013.01); *G01R 31/3004* (2013.01); *G01R 31/31703* (2013.01);
(Continued)

(58) Field of Classification Search
CPC ........... G06K 7/0095; G06K 19/07749; G06K 19/0723; G06K 7/0008; G01R 31/31706;
(Continued)

(56) References Cited

U.S. PATENT DOCUMENTS 7,151,442 B1 * 12/2006 Nguyen .............. G07C 9/00111
340/428
2002/0130778 A1 * 9/2002 Nicholson ............ B65D 5/4233
340/572.1
(Continued)

FOREIGN PATENT DOCUMENTS

CN       201698646 U  *  1/2011
CN       104921358         9/2015
(Continued)

OTHER PUBLICATIONS

English Machine Translation of Zheng US 201698646 (Year: 2011).*
(Continued)

*Primary Examiner* — Lee E Rodak

(57) ABSTRACT

Methods and systems are provided for testing and/or programming a thread-type string of RFID tags or devices. A thread-type RFID tag is formed on a length or thread having an RFID chip, a first antenna section and a second antenna section, the first and second antenna sections being positioned on the length of thread on opposite sides of the RFID chip. An RFID reader is positioned in electronic communication with a first coupler and a second coupler lying along a path, and the RFID tag and couplers are in relative motion with respect to each other such that the first and second couplers are on opposite sides of the RFID chip. A differential electric field is applied between the first coupler and the second coupler and across the RFID chip whereby the RFID reader couples to the RFID chip and interacts with the RFID tag to carry out testing and/or programming tasks with respect to the RFID tag.

8 Claims, 4 Drawing Sheets

(51) Int. Cl.
*G06K 7/00* (2006.01)
*G01R 31/50* (2020.01)
*G01R 31/30* (2006.01)
*G06K 19/07* (2006.01)

(52) U.S. Cl.
CPC ....... *G01R 31/31706* (2013.01); *G01R 31/50* (2020.01); *G06K 7/0008* (2013.01); *G06K 19/0723* (2013.01); *G06K 19/07749* (2013.01)

(58) Field of Classification Search
CPC .......... G01R 31/31703; G01R 31/3004; G01R 31/02
See application file for complete search history.

(56) References Cited

U.S. PATENT DOCUMENTS

| | | | |
|---|---|---|---|
| 2003/0090557 A1 | 5/2003 | Lenkl | |
| 2004/0160233 A1* | 8/2004 | Forster | G06K 7/0008 324/667 |
| 2004/0188531 A1* | 9/2004 | Gengel | G06K 19/027 235/491 |
| 2005/0150102 A1* | 7/2005 | Bosco | G06K 7/0095 29/593 |
| 2006/0226982 A1* | 10/2006 | Forster | G06K 7/0008 340/572.1 |
| 2006/0250246 A1* | 11/2006 | Forster | G06K 7/0008 340/572.1 |
| 2006/0271328 A1 | 11/2006 | Forster | |
| 2007/0210923 A1 | 9/2007 | Butler et al. | |
| 2008/0007479 A1 | 1/2008 | Hiltmann et al. | |
| 2008/0012709 A1 | 1/2008 | Stobbe et al. | |
| 2008/0074272 A1 | 3/2008 | Stobbe et al. | |
| 2009/0303010 A1* | 12/2009 | Sakama | G06K 19/07749 340/10.1 |
| 2010/0321161 A1 | 12/2010 | Isabell | |
| 2011/0147462 A1 | 6/2011 | Speich | |
| 2011/0303751 A1* | 12/2011 | Lai | G06K 19/027 235/492 |
| 2014/0103116 A1 | 4/2014 | Martin et al. | |
| 2014/0291409 A1 | 10/2014 | Nitta | |
| 2014/0343720 A1 | 11/2014 | Danelski | |
| 2015/0206043 A1* | 7/2015 | Huang | G06K 19/07762 235/492 |
| 2015/0278671 A1 | 10/2015 | Martin et al. | |
| 2016/0003895 A1 | 1/2016 | Farr et al. | |

FOREIGN PATENT DOCUMENTS

| | | |
|---|---|---|
| EP | 2765537 | 8/2014 |
| EP | 2772873 | 9/2014 |
| JP | 2010-165150 | 7/2010 |
| JP | 2013-142950 | 7/2013 |
| KR | 10-0914951 | 8/2009 |
| KR | 10-1187145 | 9/2012 |
| WO | 2005/102718 | 11/2005 |
| WO | 2015/063393 | 5/2015 |

OTHER PUBLICATIONS

International Search Report and Written Opinion dated Mar. 14, 2018 issued in corresponding IA No. PCT/US2017/062041 filed Nov. 16, 2017.
International Preliminary Report on Patentability dated May 31, 2019 issued in corresponding IA No. PCT/US2017/062041 filed Nov. 16, 2017.
Rahman, Mustafijur et al., Recent Innovations in Yarn Technology: A Review, International Journal of Scientific and Research Publications, vol. 4, Issue 6, Jun. 2014, 7 pages, http://www.ijsrp.org/research-paper-0614/ijsrp-p3036.pdf.

* cited by examiner

PROGRAMMING AND TESTING OF WIRE RFID TAGS

CROSS-REFERENCE TO RELATED APPLICATION(S)

The present application claims priority to and the benefit of U.S. provisional patent application Ser. No. 62/422,968 filed on Nov. 16, 2016, which is incorporated herein by reference in its entirety.

BACKGROUND

Field of the Disclosure

The present subject matter relates to radio frequency identification ("RFID") devices. More particularly, the present subject matter relates to methods and systems for programming and/or testing wire or thread-type RFID tags having antenna components suitable for these types of RFID tags.

Description of Related Art

RFID tags are widely used to associate an object with an identification code. The RFID tag is provided in combination with an RFID reader that sends signals to and receives signals from any RFID tags within the read field of the RFID reader.

Wire has long been used as RFID antenna material. Depending on the nature of the wire it can exhibit characteristics of strength, flexibility, and being a good conductor of radio frequency ("RF") energy. Wire antennas can be a component of RFID devices and RFID tags. Somewhat recently, work has focused on incorporating wire antennas into threads, or yarns, facilitating insertion of antenna-containing RFD devices into clothing items or other soft goods for inventory control, identification, labeling, tracking, and/or theft prevention purposes.

It is customary or essential for RFID devices or tags to be programmed and/or tested for proper function or identification purposes, by introducing or measuring RFID strap or tag characteristics, such as by coupling through a dielectric. Prior approaches in this regard concern systems and methods for capacitive coupling testing as exemplified by United States Patent Application Publication No. 2016/0003895 of applicant, incorporated by reference hereinto. Systems of this type can include a meter, test pads, springs, wiring, etc. For example, quality testing approaches may have test pads contact a substrate opposite of an RFID strap, and the coupling capacitance through the dielectric substrate may be utilized to determine physical characteristics, such as calculating strap capacitance. It is known that other properties of an RFID device, strap, assembly or tag can be detected and/or measured, such as other electrical properties, including resistance or impedance, typically by coupling through a dielectric.

Customary testing and programming systems for RFID devices are generally adapted to RFID device structures such as rolls of labels, cut tickets or other generally flat structures. Same are generally supplied from a reel as a linear sequence of RFID devices. Prior standard type couplers used in testing and/or programming units are not well suited when the sequence is along a thread length. Testing and programming systems heretofore can be keyed to the presence of a matching loop between the RFID chip and the antenna arrangement of the RFID device. This loop component is useful in this regard in that the loop produces a near magnetic field response for testing systems with which to couple. This approach and type of system is used in a number of prior systems and methods for programming or testing RFID labels.

SUMMARY

There are several aspects of the present subject matter which may be embodied separately or together in the devices and systems described and claimed below. These aspects may be employed alone or in combination with other aspects of the subject matter described herein, and the description of these aspects together is not intended to preclude the use of these aspects separately or the claiming of such aspects separately or in different combinations as set forth in the claims appended hereto.

The present disclosure recognizes that prior RFID testing and/or programming systems and methods can be very problematic, or simply not suitable for, thread-type RFID tags. This disclosure addresses this perceived need, disclosing multiple embodiments adapted to and arranged for testing and/or programming of thread-type or yarn-type RFID devices or tags. Accordingly, the present disclosure provides methods and systems of testing and/or programming of these types of RFID products.

In one aspect, a method and/or system is provided for testing and/or programming of RFID thread-type or yarn tags that have a length of thread, an RFID chip and one or more antenna sections, with the antenna section or sections positioned on the length of thread. Typically two or more such antenna sections are positioned on the length of thread on opposite sides of the RFID chip. An RFID reader is positioned in electronic communication with a first coupler and a second coupler, each lying along a path, and the thread-type RFID tag and path undergo relative movement such that the first and second couplers are on opposite sides of the RFID chip. With this arrangement, a differential electric field is applied between the first coupler and the second coupler and across the RFID chip whereby the RFID reader couples to the RFID chip and interacts with the RFID tag to carry out testing and/or programming tasks with respect to the thread-type RFID tag.

In a further aspect, a method and/or system is provided for testing and/or programming of RFID thread-type or yarn tags that have a length of thread, an RFID chip and one or more antenna sections, with the antenna section or sections positioned on the length of thread. Typically two or more such antenna sections are positioned on the length of thread on opposite sides of the RFID chip. An RFID reader is positioned in electronic communication with a first coupler and a second coupler, each lying along a path, and the thread-type RFID tag and path undergo relative movement such that the first and second couplers are on opposite sides of the RFID chip. The first coupler is in electronic communication with the first antenna section, and the second coupler is in electronic communication with the second antenna section. With this arrangement, a differential electric field is applied between the first coupler and the second coupler and across the RFID chip whereby the RFID reader couples to the RFID chip and interacts with the RFID tag to carry out testing and/or programming tasks with respect to the thread-type RFID tag.

In an additional aspect, a method and/or system is provided for testing and/or programming of RFID thread-type or yarn tags that have a length of thread, an RFID chip and one or more antenna sections, with the antenna section or sections positioned on the length of thread. Typically two or more such antenna sections are positioned on the length of thread on opposite sides of the RFID chip. An RFID reader is positioned in electronic communication with a first coupler and a second coupler, each lying along a path, and the thread-type RFID tag and path undergo relative movement such that the first and second couplers are on opposite sides of the RFID chip, the thread passes along the first and second couplers, each coupler being a ring through which the length of thread passes. The first coupler is in electronic communication with the first antenna section, and the second coupler is in electronic communication with the second antenna section. With this arrangement, a differential electric field is applied between the first coupler and the second coupler and across the RFID chip whereby the RFID reader couples to the RFID chip and interacts with the RFID tag to carry out testing and/or programming tasks with respect to the thread-type RFID tag.

In an added aspect, a method and/or system is provided for testing and/or programming of RFID thread-type or yarn tags that have a length of thread, an RFID chip and one or more antenna sections, with the antenna section or sections positioned on the length of thread. Typically two or more such antenna sections are positioned on the length of thread on opposite sides of the RFID chip. An RFID reader is positioned in electronic communication with a first coupler and a second coupler, each lying along a path, and the thread-type RFID tag and path undergo relative movement such that the first and second couplers are on opposite sides of the RFID chip, the thread passes along the first and second couplers, each coupler being a roller along which the length of thread passes. The first coupler is in electronic communication with the first antenna section, and the second coupler is in electronic communication with the second antenna section. With this arrangement, a differential electric field is applied between the first coupler and the second coupler and across the RFID chip whereby the RFID reader couples to the RFID chip and interacts with the RFID tag to carry out testing and/or programming tasks with respect to the thread-type RFID tag.

In one aspect, a method and/or system is provided for testing and/or programming of RFID thread-type or yarn tags that have a length of thread, an RFID chip and one or more antenna sections, with the antenna section or sections positioned on the length of thread. Typically two or more such antenna sections are positioned on the length of thread on opposite sides of the RFID chip. An RFID reader is positioned in electronic communication with a first coupler and a second coupler, each lying along a path, and the thread-type RFID tag and path undergo relative movement such that the first and second couplers are on opposite sides of the RFID chip, the thread passes along the first and second couplers, each coupler being a ring through which the length of thread passes or a roller along which the length of thread passes. The first coupler is in electronic communication with the first antenna section, and the second coupler is in electronic communication with the second antenna section. With this arrangement, a differential electric field is applied between the first coupler and the second coupler and across the RFID chip whereby the RFID reader couples to the RFID chip and interacts with the RFID tag to carry out testing and/or programming tasks with respect to the thread-type RFID tag. Differential voltage is suppressed between the first and second coupler rings or rollers, including providing a first outer ground ring or roller and a second outer ground ring or roller, wherein the first coupler is between the first outer ground ring or roller and the RFID chip and the second coupler is between the second outer ground ring or roller and the RFID chip, thereby suppressing differential voltage leakage According to a further aspect, a method and/or system is provided for testing and/or programming of RFID thread-type or yarn tags that have a length of thread, an RFID chip and one or more antenna sections, with the antenna section or sections positioned on the length of thread. Typically two or more such antenna sections are positioned on the length of thread on opposite sides of the RFID chip. An RFID reader is positioned in electronic communication with a first coupler and a second coupler, each lying along a path, and the thread-type RFID tag and path undergo relative movement such that the first and second couplers are on opposite sides of the RFID chip. With this arrangement, a differential electric field is applied between the first coupler and the second coupler and across the RFID chip whereby the RFID reader couples to the RFID chip and interacts with the RFID tag to carry out testing and/or programming tasks with respect to the thread-type RFID tag. The path of the RFID thread-type tags is along a spiral roller, and the passing is along the first and second couplers forming a virtual loop and creating a magnetic signature of the spiral path.

In another aspect, a method and/or system is provided for testing and/or programming of RFID thread-type or yarn tags that have a length of thread, an RFID chip and one or more antenna sections, with the antenna section or sections positioned on the length of thread. Typically two or more such antenna sections are positioned on the length of thread on opposite sides of the RFID chip. An RFID reader is positioned in electronic communication with a first coupler and a second coupler, each lying along a path, and the thread-type RFID tag and path undergo relative movement such that the first and second couplers are on opposite sides of the RFID chip. With this arrangement, a differential electric field is applied between the first coupler and the second coupler and across the RFID chip whereby the RFID reader couples to the RFID chip and interacts with the RFID tag to carry out testing and/or programming tasks with respect to the thread-type RFID tag. An ink substance is dispensed onto a length of the thread and provides data concerning the RFID tag. In embodiments, the coding system comprises ink marked areas and gap areas between at least some of the marked areas, and wherein the reading is carried out by a system selected from the group consisting of a magnetic pickup system, an optical energy source and a detector for optical markings, and combinations thereof.

DESCRIPTION OF THE ILLUSTRATED EMBODIMENTS

As required, detailed embodiments of the present invention are disclosed herein; however, it is to be understood that the disclosed embodiments are merely exemplary of the invention, which may be embodied in various forms. Therefore, specific details disclosed herein are not to be interpreted as limiting, but merely as a basis for the claims and as a representative basis for teaching one skilled in the art to variously employ the present invention in virtually any appropriate manner.

Figure 1:
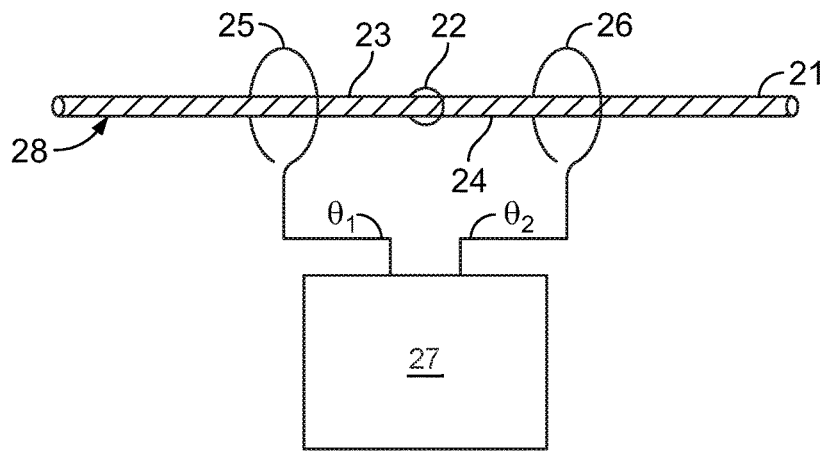
FIG. 1 is a diagrammatic view of an exemplary embodiment system and/or method for testing yarn-type RFID tags by which a differential electrical field is applied to two rings and across the chip of the RFID tag.

FIG. 1 shows an exemplary system or embodiment for testing and/or programming thread-type or yarn-type RFID devices or tags 21, each having an RFID chip 22 and first antenna section 23 and second antenna section 24 on either side of the RFID chip. The couplers in this embodiment take the form of two coupling rings 25, 26 associated with phase 1 "Ø1" and phase 2 "Ø2" of the electric field. It will be understood that Ø1=Ø2+180 degrees. The tags and the coupling rings are arranged to move with respect to each other. For example, the RFID devices 21 can be in a linear sequence along a moving thread that passes through the two rings 25, 26. The rings 25, 26 are in electronic communication with an RFID reader 27. However the relative movement is achieved, when the chip and central portion of the antenna is between the rings 25, 26, a differential electric field is applied across the chip, allowing the RFID reader system 27 to couple to the chip. It will be appreciated that when the term "ring" or "rings" is used herein, same can indicate a cylindrical member that is not specifically limited to the axial length of the ring. For example, a ring can have a very short axial length resembling a two-dimensional structure such as a circle, or a ring can have a more substantial axial length to resemble a tube or channel.

The RFID reader system 27 coupled to the RFID chip 22 then can carry out tasks such a reading memory in the RFID device, writing memory in the device, or carrying out a test to determine whether or not the RFID tag 21 is operational within defined respective acceptable or target ranges of one or more parameters associated with the device. When desired, operation of the RFID reader unit can be triggered either by an optical sensor or by another type of sensor to determine the chip position. Alternatively, triggering can be by the change in RF characteristics when the RFID chip 22 is between the coupling points.

Figure 2:
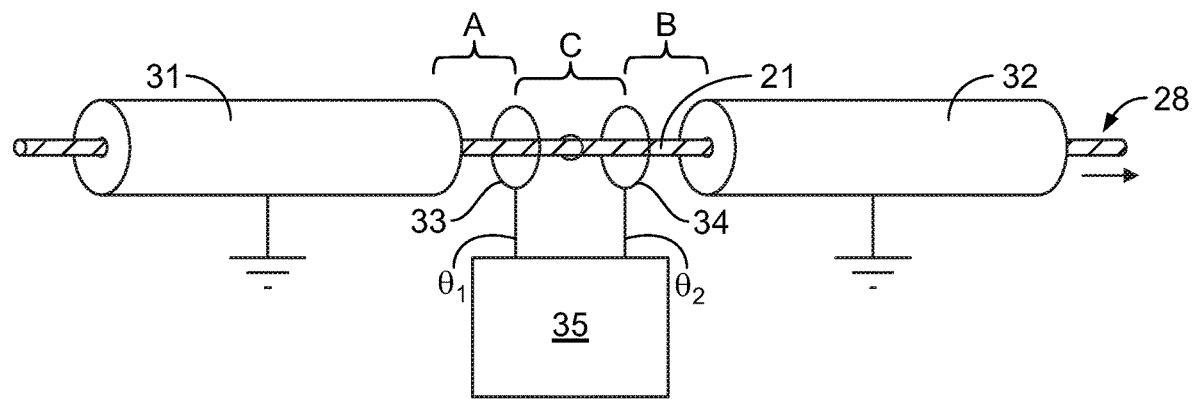
FIG. 2 is a diagrammatic view that illustrates another embodiment that follows electronic field encoding with radiated signal suppression incorporating a divided tube or channel.

FIG. 2 illustrates a variation on the FIG. 1 system or method that addresses a potential issue with the FIG. 1 approach; namely, that the antenna section on either side of the RFID chip have a differential voltage applied, and hence may radiate or couple to tags further up or down the linear string or thread 28, generally designated at 28, of RFID tags 21. In the FIG. 2 version, each RFID tag 21 passes through (or otherwise moves with respect to) a tube or channel in what can be considered to be four parts, two being illustrated as a first outer section 31 and a second outer section 32 located on opposite sides of the RFID chip 22 at the position shown in FIG. 2, each being attached to the system ground as shown in FIG. 2. In the illustration of FIG. 2, each first and second outer sections are rings that have an axial length substantially greater than the other two components of the tube or channel, namely inner coupling rings, which can be considered to be a first inner section 33 and a second inner section 34, located on opposite sides of the RFID chip 22 at the position shown in FIG. 2. When the thread 28 moves for passing through the tube or channel, movement is in a left-to-right direction as in FIG. 2.

The first and second inner sections 33, 34 communicate with a reader 35 and have a differential electric field applied. The system of FIG. 2 has three gaps: gap "A" is from ground to phase at the first inner section 33 (phase 1 or "Ø1"); gap "B" is from ground to phase at the second inner section 34 (phase 2 or "Ø2"); and "C" is from "Ø1" to "Ø2." When an RFID chip 21 along the thread 28 is in position "A", there is potentially a signal across it—between phase 1 "Ø1" and ground; however, at this point the wire of the antenna is bridging phase 1 "Ø1" and phase 2 "Ø2", resulting in suppression of the differential voltage so a lower level of coupling to the chip occurs, which can be arranged to be below the communication threshold. When the chip is in position "B", a differential voltage is applied across the chip as previously; however, the antenna sections on either side of the coupling point are at a ground potential by coupling to the pipe or channel 31.

The gap "C" between the phase 1 and the phase 2 coupling points and the ground section of the coupler provide a series inductance in the form of the yarn or thread 28 to ground which is used as part of the RF matching solution. The ground section of the tube or channel can be a conductor such as copper or a resistive material such as carbon; or the connection of the tube or channel to ground can be via a resistance to absorb the RF energy. With the approach of FIG. 2, there is achieved electronic field encoding with radiated signal suppression.

Figure 3A:
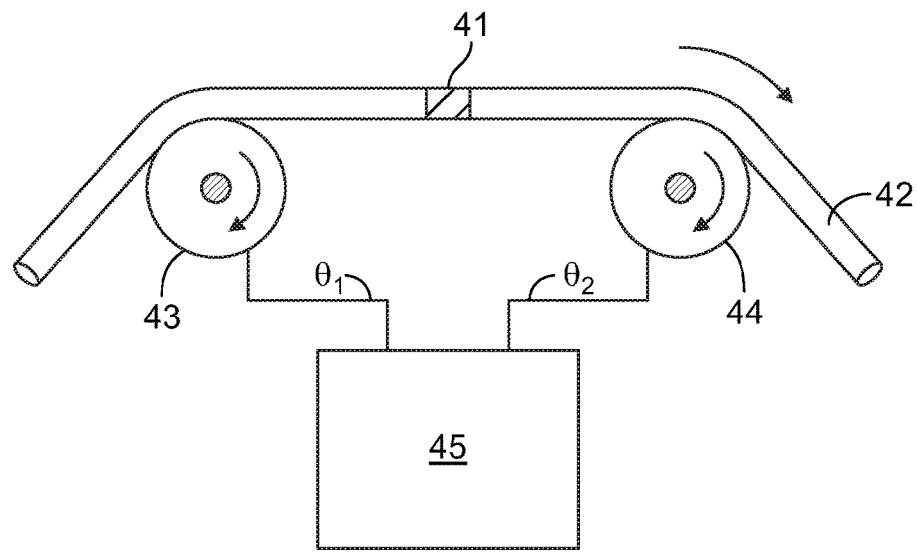
FIG. 3A is a diagrammatic view of an additional embodiment wherein coupling points are in the form of rollers.

In FIG. 3(a), the coupler takes the form of a roller system. One of the RFID chips 41 along this RFID thread or linear string 42 is shown at a location of relative movement between the thread 42 and a pair or spaced apart conductive rollers 43, 44. This system is shown with an RFID chip 41 between the conductive rollers 43, 44. The coupling conductive rollers provide coupling points which have a differential voltage across them. This can be considered a two-roller system. The coupling conductive rollers 43, 44 are in electronic communication with an RFID reader 45 associated with phase 1 "Ø1" and phase 2 "Ø2" of the electric field. During relative movement, when the RFID chip 41 and central portion of the antenna is between the rollers, a differential electric field is applied across the chip, allowing the RFID reader system 45 to couple to the chip.

The RFID reader system 45 coupled to the RFID chip 41 then can carry out tasks such a reading memory in the RFID device, writing memory in the device, or carrying out a test to determine whether or not the RFID tag is operational within defined respective acceptable or target ranges of one or more parameters associated with the device. When desired, operation of the RFID reader unit can be triggered either by an optical sensor or by another type of sensor to determine the chip position. Alternatively, triggering can be by the change in RF characteristics when the RFID chip 41 is between the coupling points.

Figure 3B:
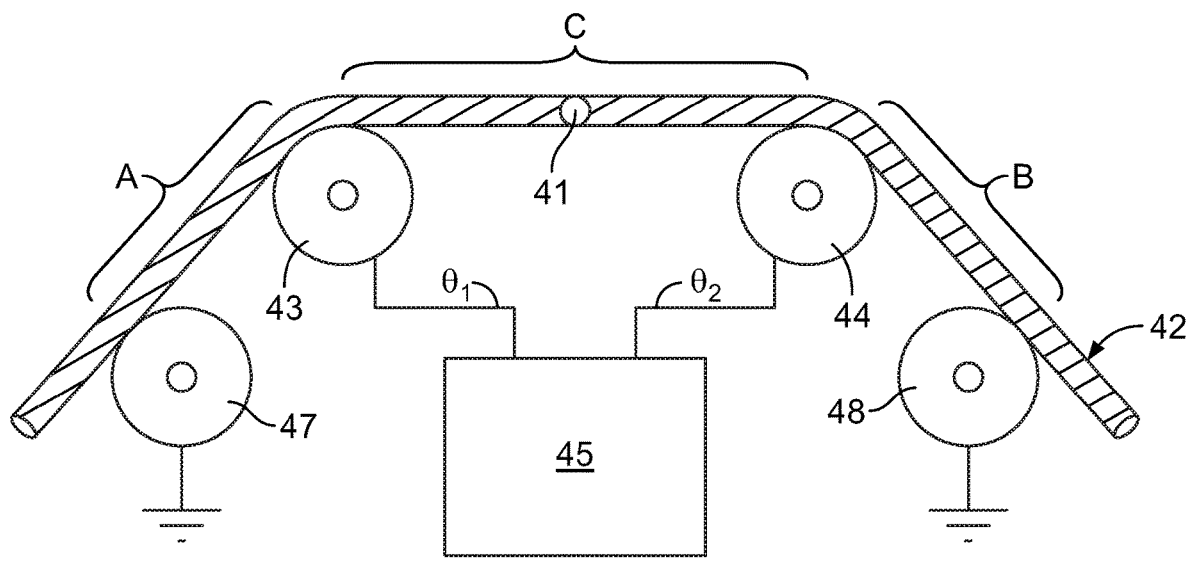
FIG. 3B is a diagrammatic view illustrating a variation of the system and/or method of FIG. 3(a), wherein the coupling rollers have one or more grounded rollers on either side.

Referring to FIG. 3(b), this illustrates a system or method that modifies the FIG. 3(a) embodiment in a manner along the lines of the modification of the FIG. 1 embodiment that is illustrated in FIG. 2. Essentially, two roller units are added to the arrangement shown in FIG. 3(a). More specifically, one or more grounded rollers are positioned outside of the coupling conductive rollers 43, 44. In the embodiment illustrated in FIG. 3(b), a first grounded roller 47 is positioned outside of the first conductive roller 43, whereby the first roller is between the first grounded roller 47 and the RFID chip. Also in this embodiment, a second grounded roller 48 is positioned outside of the second conductive roller 44, whereby the second conductive roller is between the second grounded roller 48 and the RFID chip 41. With these orientations, the grounded rollers can be identified as outer first grounded roller 47 and outer second grounded roller 48.

In the FIG. 3(b) version, each RFID tag 41 passes through (or otherwise moves with respect to) the four rollers 47, 43, 44, 48. When the thread 42 moves for passing through the tube or channel, movement is in a left-to-right direction as in FIG. 3(b). The first and second inner conductive rollers 43, 44 communicate with a reader 45 and have a differential electric field applied. The system of FIG. 2 has three gaps: gap "A" is from ground to phase at the first inner conductive roller 43 (phase 1 or "Ø1"); gap "B" is from ground to phase at the second inner conductive roller 44 (phase 2 or "Ø2"); and "C" is from "Ø1" to "Ø2." When an RFID chip 41 along the thread 42 is in position "A", there is potentially a signal across it—between phase 1 "Ø1" and ground; however, at this point the wire of the antenna is bridging phase 1 "Ø1" and phase 2 "Ø2", resulting in suppression of the differential voltage so a lower level of coupling to the chip occurs, which can be arranged to be below the communication threshold. When the chip is in position "B", a differential voltage is applied across the chip as previously; however, the antenna sections on either side are at a ground potential.

Figure 4A:
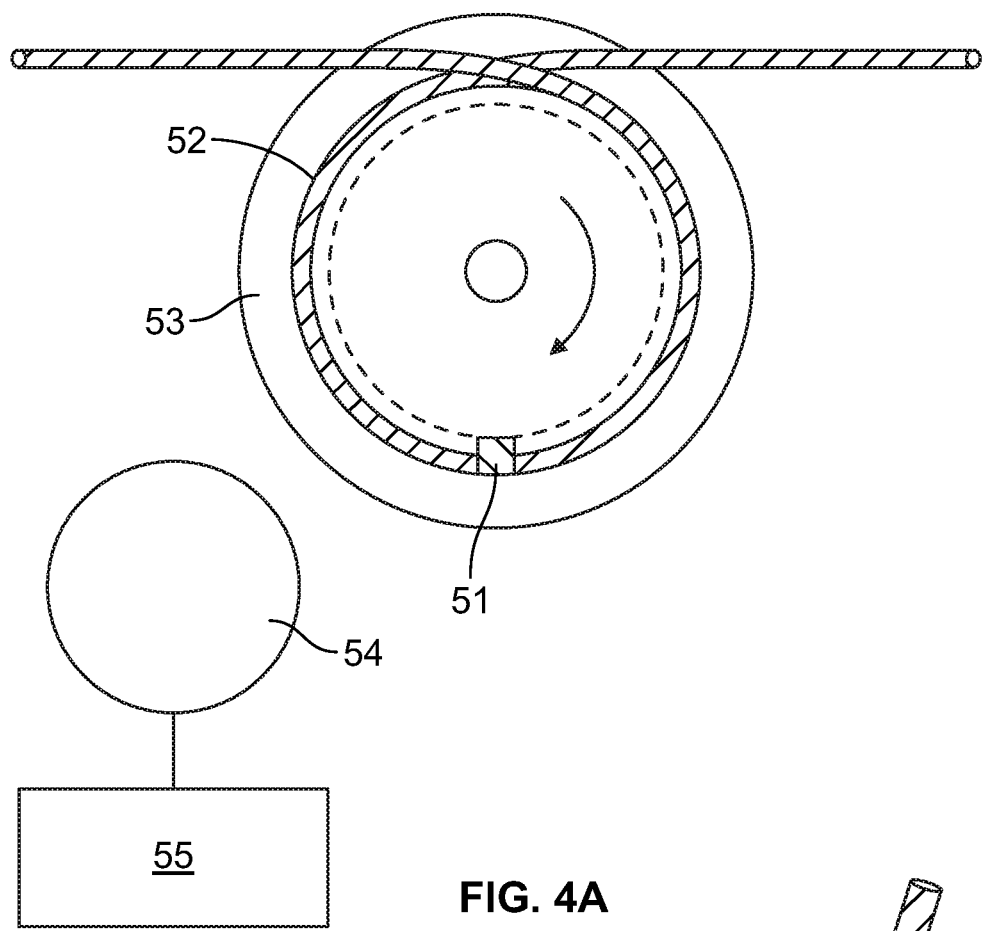
FIG. 4A is a diagrammatic front elevational view illustrating a further embodiment by which the yarn device is passed around a roller in spiral fashion.

The gap "C" between the phase 1 and the phase 2 coupling points and the ground section of the coupler provide a series inductance in the form of the yarn or thread 42 to ground which is used as part of the RF matching solution. With the approach of FIG. 3(b), there is achieved electronic field encoding with radiated signal suppression. The ground rollers 47, 48 may be metallic, providing a low resistance to ground, or the roller—or its connection to ground—can be resistive, adsorbing RF energy With the embodiment of FIG. 4(a) and FIG. 4(b), the linear string, thread or yarn 52 is passed around a roller 53 in a spiral fashion. The coupler approach of this embodiment achieves coupling by way of adjacent turns in the spiral creating a virtual loop around the RFID chip 51. This creates a magnetic signature for the thread or yarn 52 and the RFID chip 51, allowing a near magnetic coupling, such as that created by a small loop antenna, to communicate with the chip 51 and the antenna of the RFID device being programmed and/or tested, in the manner described herein with respect to other embodiments. This is illustrated somewhat schematically in FIG. 4(a), a double arrow representing electronic connection between the roller 53 and the RFID reader 55, with electronic field coupling and inclusion of a loop antenna 54.

Figure 4B:
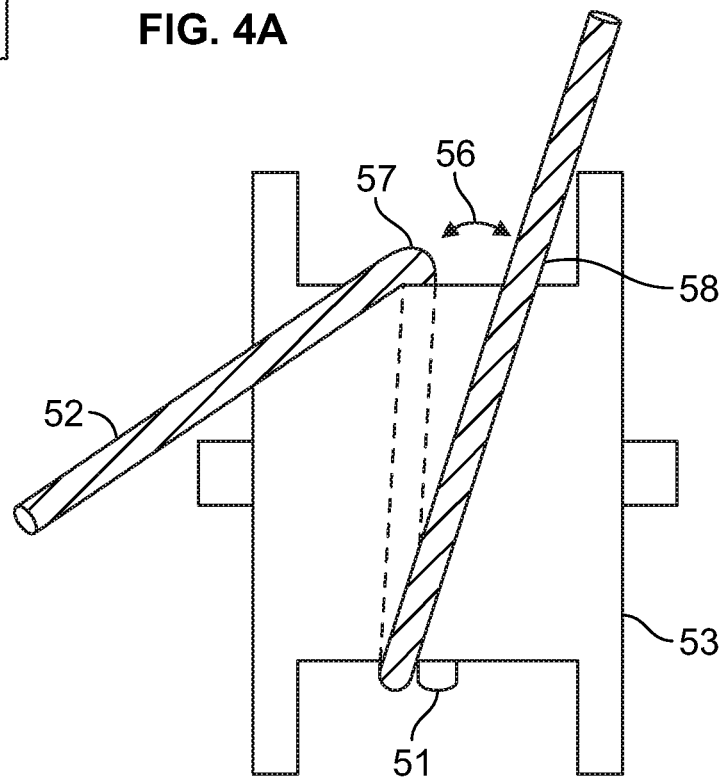
FIG. 4B is a diagrammatic end elevational view of the embodiment shown in FIG. 4(a)

FIG. 4(b) provides a short double arrow 56 indicating the coupling effect that is achieved by creating the loop type structure with a first coupler loop area being represented by a first rolling coupling loop 57 spaced apart at coupling arrow 56 from a second rolling coupling loop 58. With this approach, the first rolling coupling loop 57 functions similar to that of the first coupling ring 25 of FIG. 1, and the second rolling coupling loop 58 functions similar to that of the second coupling ring 26 of FIG. 1

Figure 5:
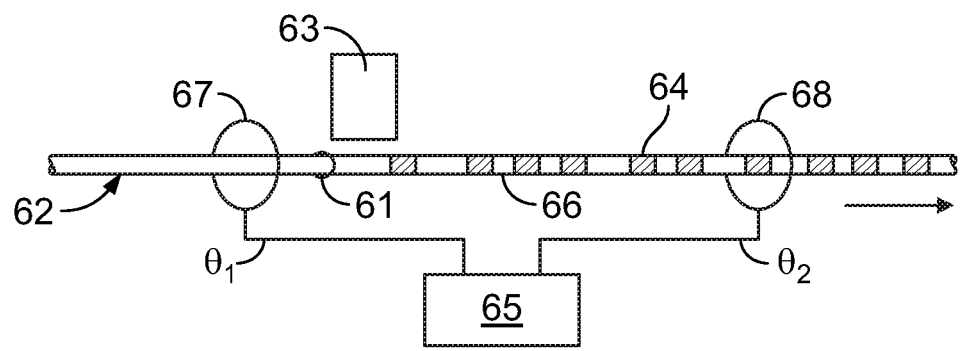
FIG. 5 is a diagrammatic view illustrating another embodiment that includes a head for transferring ink to the thread.

A further embodiment involves a thread coding system as shown in FIG. 5. A linear string, thread or yarn 62 includes chips 61, a possible position for a chip being shown at 61 in FIG. 5. While this is illustrated in an electronic field encoding arrangement having coupling rings 67, 68 in communication with an RFID reader, other electronic field coding systems can be utilized, such as those illustrated herein. This FIG. 5 embodiment includes a head 63 capable of dispersing and/or printing. For example, the head 63 is capable of transferring ink to the linear string, thread or yarn 62. Typical types of inks can be black or any other color; the ink can be a UV fluorescent ink, a magnetic ink or a conductive ink, for example.

In one embodiment, the ink is applied so as to form a marked area 64 such as a ring at desired location or locations along the thread 62, multiple marked areas 64 being shown in FIG. 5. Having the marked areas each be a generally transverse ring around the thread 62 reduces the likelihood of inconsistencies when the marked area is being read by a sensor, which could vary upon rotation of the thread 62. Alternatively, multiple sensors could reduce the likelihood of inconsistent and/or incorrect readings of information, location and/or data from the marked areas 64 due to thread rotation or other placement inconsistencies.

Figure 6A:
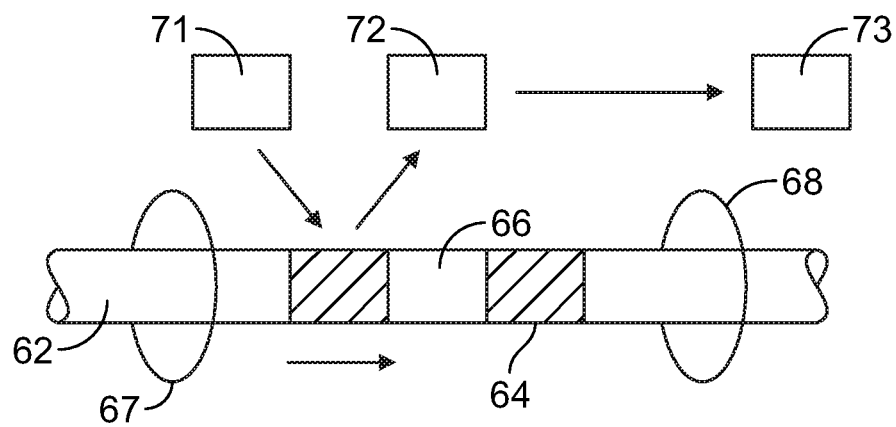
FIG. 6A is a diagrammatic view of a system and/or method feature following optical mark detection.

With the ink transferred to form the marked areas 64, the transferred material can be used to add a code, in the form of locations of the marked areas and locations along the length of the thread that are not so marked, being gap areas 66 that are components of coded data. If desired, the data printed can relate to the data programmed into the RFID chip 61. In this instance, the presence of the code allows the data to be accessed at a later point in a manufacturing process without using RFID. For example, with the thread 62 moving with respect to a ring or a channel as in FIGS. 1-2, or other coupling arrangement such as shown herein, a sensor combining with an illuminator and a detector can be used for recognizing optical markings as illustrated in FIG. 6(a). Alternatively or additionally, a coil-type magnetic pickup for magnetic activity, as shown in FIG. 6(b) can be used.

Figure 6B:
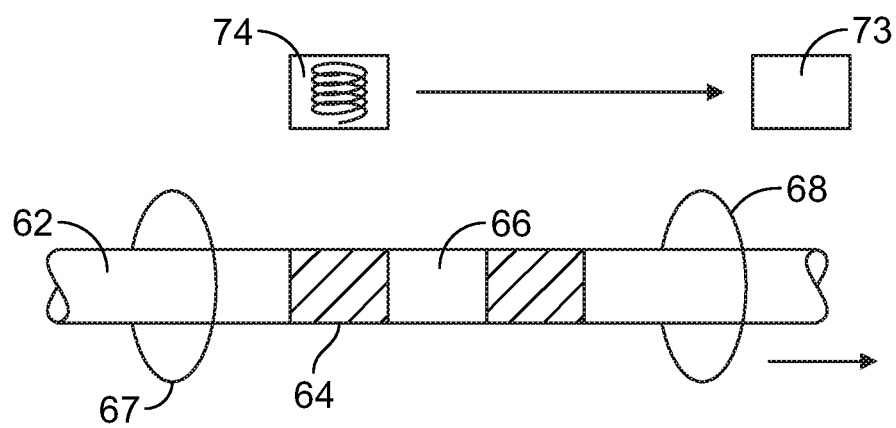
FIG. 6B is a diagrammatic view of a system and/or method feature following magnetic mark detection.

The type of code contemplated by the embodiments of FIG. 5, FIG. 6(a) and/or FIG. 6(b) can be used to retrieve data at short range when the RFID function is unavailable, for example when RFID function has failed due to environmental issues, intentionally been disabled electronically, or no RFID reader 65 is available. An example of use of this type of thread capability is to facilitate recycling. With the expectation that multiple repeats of the code are printed, even if the thread or fabric is chopped up, sections of the complete code are likely to be retained, even if the RFID tag has been destroyed.

Concerning the use of an illuminator and a detector for optical markings, FIG. 6(a) illustrates how such an arrangement can be positioned with respect to the thread coding system of FIG. 5. An optical illuminator 71 directs light energy toward the thread 62, interacts with a marked area 64 and/or a gap area 66, followed by recognition by an optical detector 72 and reception by and/or analysis by a data storage and/or processing unit 73 that can provide running data as the thread moves relative to the field encoding arrangement.

For the FIG. 6(b) embodiment, the ink in the marked areas is a magnetic ink. This embodiment illustrates how a magnetic pickup system arrangement can be positioned with respect to the thread coding system of FIG. 5. A magnetic sensor 74 directs magnetic properties of each marked area 64 and/or lack thereof at a gap area 66, followed by reception at and/or analysis by a data storage and/or processing unit 73 that can provide running data as the thread moves relative to the field encoding arrangement.

It will be understood that the embodiments described above are illustrative of some of the applications of the principles of the present subject matter. Numerous modifications may be made by those skilled in the art without departing from the spirit and scope of the claimed subject matter, including those combinations of features that are individually disclosed or claimed herein. For these reasons, the scope hereof is not limited to the above description but is as set forth in the following claims, and it is understood that claims may be directed to the features hereof including as combinations of features that are individually disclosed or claimed herein.

The invention claimed is:

1. A method of testing and/or programming a thread-type RFID tag, comprising:
   forming a thread-type RFID tag comprising a length of thread, an RFID chip, a first antenna section and a second antenna section, the first and second antenna sections being positioned on the length of thread on opposite sides of the RFID chip;
   positioning an RFID reader in electronic communication with a first coupler and a second coupler lying along a path;
   passing the thread type RFID tag along the path such that the first and second couplers are on opposite sides of the RFID chip; and
   applying a differential electric field between the first coupler and the second coupler and across the RFID chip whereby the RFID reader couples to the RFID chip and interacts with the RFID tag to carry out testing and/or programming tasks with respect to the RFID tag,
   wherein the path is a spiral path along a roller, the passing is along the first and second couplers forming a virtual loop and creating a magnetic signature of the spiral path.

2. The method in accordance with claim 1, further including dispersing an ink substance onto the length of thread and providing a coding system incorporating the ink substance, and reading the coding system to provide data concerning the RFID tag.

3. The method in accordance with claim 2, wherein the coding system comprises ink marked areas and gap areas between at least some of the marked areas, and wherein the reading is carried out by a system selected from the group consisting of a magnetic pickup system, an optical energy source and a detector for optical markings, and combinations thereof.

4. A method of testing and/or programming a thread-type RFID tag, comprising:
   forming a thread-type RFID tag comprising a length of thread, an RFID chip, a first antenna section and a second antenna section, the first and second antenna sections being positioned on the length of thread on opposite sides of the RFID chip;
   positioning an RFID reader in electronic communication with a first coupler and a second coupler lying along a path, the first coupler is in electronic communication with the first antenna section, and the second coupler is in electronic communication with the second antenna section;
   passing the thread type RFID tag along the path such that the first and second couplers are on opposite sides of the RFID chip; and
   applying a differential electric field between the first coupler and the second coupler and across the RFID chip whereby the RFID reader couples to the RFID chip and interacts with the RFID tag to carry out testing and/or programming tasks with respect to the RFID tag,
   wherein the path is a spiral path along a roller, the passing is along the first and second couplers forming a virtual loop and creating a magnetic signature of the spiral path.

5. The method in accordance with claim 4, further including dispersing an ink substance onto the length of thread and providing a coding system incorporating the ink substance, and reading the coding system to provide data concerning the RFID tag, the coding system comprising ink marked areas and gap areas between at least some of the marked areas, and wherein the reading is carried out by a system selected from the group consisting of a magnetic pickup system, an optical energy source and a detector for optical markings, and combinations thereof.

6. A system for testing and/or programming a thread-type RFID tag, comprising:
   a thread-type RFID tag comprising a length of thread, an RFID chip, a first antenna section and a second antenna section, the first and second antenna sections being positioned on the length of thread on opposite sides of the RFID chip;
   an RFID reader in electronic communication with a first coupler and a second coupler lying along a path;
   the thread type RFID tag passes along the path such that the first and second couplers are on opposite sides of the RFID chip; and
   a differential electric field that is applied between the first coupler and the second coupler and across the RFID chip whereby the RFID reader electronically couples to the RFID chip and interacts with the RFID tag to carry out testing and/or programming tasks with respect to the RFID tag,
   wherein the path is a spiral path along a roller, the passing is along the first and second couplers forming a virtual loop and creating a magnetic signature of the spiral path.

7. The system in accordance with claim 6, wherein the first coupler is in electronic communication with the first antenna section, and the second coupler is in electronic communication with the second antenna section.

8. The system in accordance with claim 6, further including a dispenser that dispenses an ink substance onto the length of thread forming a coding system incorporating the ink substance, and a reader associated with the coding system to provide data concerning the RFID tag, the reader being selected from the group consisting of a system selected from the group consisting of a magnetic pickup system, an optical energy source and a detector for optical markings, and combinations thereof, and the coding system comprises ink marked areas and gap areas between at least some of the marked areas, and wherein the reading is carried out by.

* * * * *